US008369124B2

(12) United States Patent
Lee

(10) Patent No.: US 8,369,124 B2
(45) Date of Patent: Feb. 5, 2013

(54) SEMICONDUCTOR MEMORY APPARATUS HAVING SENSE AMPLIFIER

(75) Inventor: Myoung Jin Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 147 days.

(21) Appl. No.: 12/964,182

(22) Filed: Dec. 9, 2010

(65) Prior Publication Data

US 2012/0026773 A1    Feb. 2, 2012

(30) Foreign Application Priority Data

Jul. 27, 2010   (KR) .................. 10-2010-0072386

(51) Int. Cl.
*G11C 5/06*    (2006.01)
(52) U.S. Cl. .................. 365/63; 365/51; 365/230.03
(58) Field of Classification Search ............ 365/63, 365/51, 230.03, 205, 207
See application file for complete search history.

(56) References Cited

U.S. PATENT DOCUMENTS

| 6,639,822 | B2 | 10/2003 | Fujisawa |
| 7,002,866 | B2 * | 2/2006 | Hirose et al. ............... 365/207 |
| 7,184,330 | B2 | 2/2007 | Tajima |
| 7,474,550 | B2 * | 1/2009 | Fujisawa et al. ............... 365/63 |
| 7,525,829 | B2 | 4/2009 | Kawakita |
| 2007/0297257 | A1 | 12/2007 | Sekiguchi |

FOREIGN PATENT DOCUMENTS

| JP | 2001-273788 | 10/2001 |
| KR | 100192928 B1 | 2/1999 |
| KR | 1020070113813 A | 11/2007 |

* cited by examiner

*Primary Examiner* — David Lam

(74) *Attorney, Agent, or Firm* — William Park & Associates Ltd.

(57) ABSTRACT

Disclosed is a semiconductor memory apparatus comprising an upper mat and a lower mat with a sense amplifier array region in between, where the sense amplifier array region includes a plurality of sense amplifiers. There is also a plurality of bit lines configured to extend toward the sense amplifier array region from the upper mat, and a plurality of complementary bit lines configured to extend toward the sense amplifier array region from the lower mat. Bit lines of the upper mat and complementary bit lines of the lower mat are configured to be alternately disposed at a predetermined interval in the sense amplifier array region, and the sense amplifier is configured to be formed between a bit line and a corresponding complementary bit line.

15 Claims, 3 Drawing Sheets

SEMICONDUCTOR MEMORY APPARATUS HAVING SENSE AMPLIFIER

CROSS-REFERENCES TO RELATED APPLICATIONS

The present application claims priority under 35 U.S.C. §119(a) to Korean application number 10-2010-0072386, filed on Jul. 27, 2010, in the Korean Intellectual Property Office, which is incorporated herein by reference in its entirety.

BACKGROUND

1. Technical Field

The present invention relates to a semiconductor integrated circuit, and more particularly, to a semiconductor memory apparatus having a sense amplifier.

2. Related Art

As the integration degree of a semiconductor memory apparatus increases, an area of each unit memory cell is reduced. As the area of each unit memory cell is reduced, attempts have been made to manufacture buried-type connection members (e.g., contact sections) for connecting switching elements, bit lines, word lines, and capacitors to one another.

At the present time, a unit cell area of a semiconductor memory apparatus is reduced from $8F^2$ (F is a minimum feature size) to $6F^2$, even further $4F^2$. Accordingly, it is also necessary to change a bit line structure for transmitting signals to a unit cell and an area of a sense amplifier for detecting and amplifying a bit line signal.

FIG. 1 is a schematic plan view illustrating a sense amplifier arrangement of a general $6F^2$ memory cell.

Referring to FIG. 1, a first mat MAT1 includes a plurality of bit lines BLn and BLn+1 and a second mat MAT2 includes a plurality of complementary bit lines /BLn and /BLn+1. The first mat MAT1 and the second mat MAT2 are spaced apart from each other by a predetermined interval in the extension direction of the bit lines, and the respective bit lines BL and complementary bit lines /BL are spaced apart from each other by the minimum feature size. As is well known in the art, since such a $6F^2$ structure has an open bit line structure, sense amplifiers S/An and S/An+1 between the mats MAT1 and MAT2 adjacent in the bit line direction are shared.

In more detail, the $n^{th}$ bit line BLn and the $(n+1)^{th}$ bit line BLn+1 of the first mat MAT1 are spaced apart from each other by the minimum feature size, and simultaneously the $n^{th}$ bit line BLn of the first mat MAT1 and the $n^{th}$ complementary bit line /BLn of the second mat MAT2 are also spaced apart from each other by the minimum feature size. Thus, the $(n+1)^{th}$ bit line BLn+1 and the $n^{th}$ complementary bit line /BLn are separate, but partially collinear.

The sense amplifiers S/An and S/An+1 are located between the $n^{th}$ bit line BLn of the first mat MAT1 and the $n^{th}$ complementary bit line /BLn of the second mat MAT2, and between the $(n+1)^{th}$ bit line BLn+1 of the first mat MAT1 and the $(n+1)^{th}$ complementary bit line /BLn+1 of the second mat MAT2, respectively. In this regard, the sense amplifiers are substantially located at one bit line pitch.

With such a structure, transistors constituting the latches of sense amplifiers S/An and S/An+1 need to be located at the distance d (i.e., the distance defined as the minimum feature size) between the bit line BL and the complementary bit line /BL, which form a pair.

Therefore, since the channel length of the transistor is equal to or less than the minimum feature size, the properties of the transistor may not be easily ensured, resulting in the reduction of the sensitivity of the sense amplifier.

SUMMARY

In one embodiment of the present invention, a semiconductor memory apparatus includes a sense amplifier array region including a plurality of sense amplifiers, and an upper mat and a lower mat configured to be disposed while interposing the sense amplifier array region in between. A plurality of bit lines may be configured to extend toward the sense amplifier array region from the upper mat and a plurality of complementary bit lines may be configured to extend toward the sense amplifier array region from the lower mat. A pair of bit lines of the upper mat and a pair of complementary bit lines of the lower mat are configured to be alternately disposed at a predetermined interval in the sense amplifier array region, and the sense amplifier is configured to be used with a bit line and a corresponding complementary bit line.

In another embodiment of the present invention, a semiconductor memory apparatus includes a sense amplifier array region, an upper mat including first and second bit lines configured to be disposed at one side of the sense amplifier array region and extend toward the sense amplifier array region while maintaining a predetermined interval therebetween, and a lower mat including first and second complementary bit lines configured to be disposed at the other side of the sense amplifier array region and extend toward the sense amplifier array region while maintaining the predetermined interval therebetween.

A first sense amplifier may be configured to be formed between the first bit line and the first complementary bit line and a second sense amplifier may be configured to be formed between the second bit line and the second complementary bit line. The second bit line is between the first bit line and the first complementary bit line, the first complementary bit line is between the second bit line and the second complementary bit line, and each bit line in the sense amplifier array region is spaced apart from its neighboring bit line by the predetermined interval.

In another embodiment of the present invention, a semiconductor memory apparatus may include an upper mat and a lower mat with a sense amplifier array region in between. The sense amplifier array region may comprise a plurality of sense amplifiers. A plurality of bit lines may extend toward the sense amplifier array region from the upper mat, and a plurality of complementary bit lines corresponding to the plurality of bit lines may extend toward the sense amplifier array region from the lower mat. There may be a first separation between each bit line and an adjacent bit line, between a complementary bit line and an adjacent complementary bit line, and between a bit line and an adjacent complementary bit line, in at least a portion of the sense amplifier array region. There may be a second separation between a bit line and a corresponding complementary bit line in at least a portion of the sense amplifier array region, where the second separation is bigger than the first separation.

BRIEF DESCRIPTION OF THE DRAWINGS

Features, aspects, and embodiments are described in conjunction with the attached drawings, in which.

DETAILED DESCRIPTION

Hereinafter, embodiments of the present invention will be described in detail with reference to the accompanying drawings such that the scope of the present invention can be easily embodied by those skilled in the art.

Figure 1:
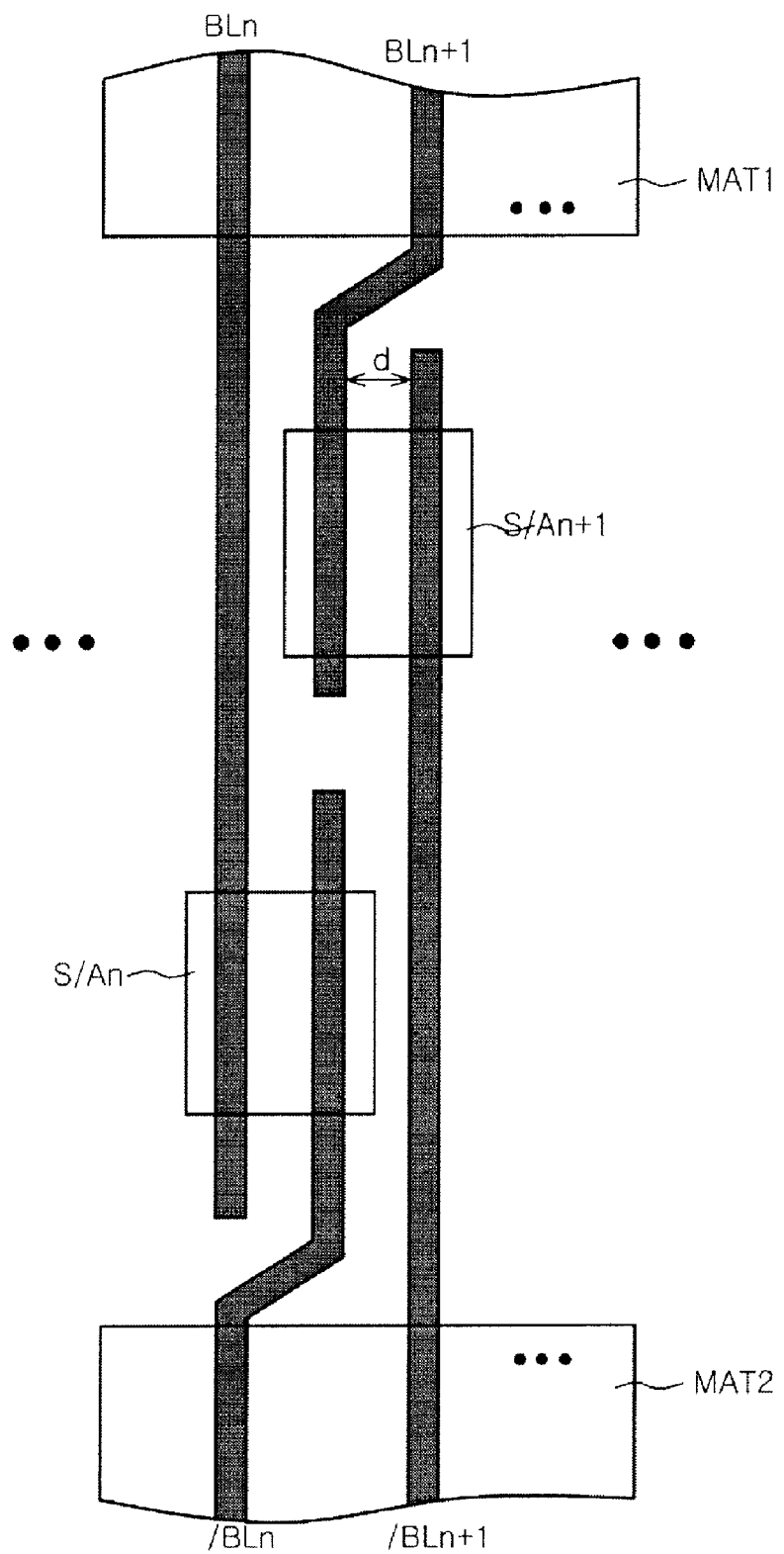
FIG. 1 is a plan view schematically illustrating a sense amplifier array region of a general semiconductor memory apparatus.
Figure 2:
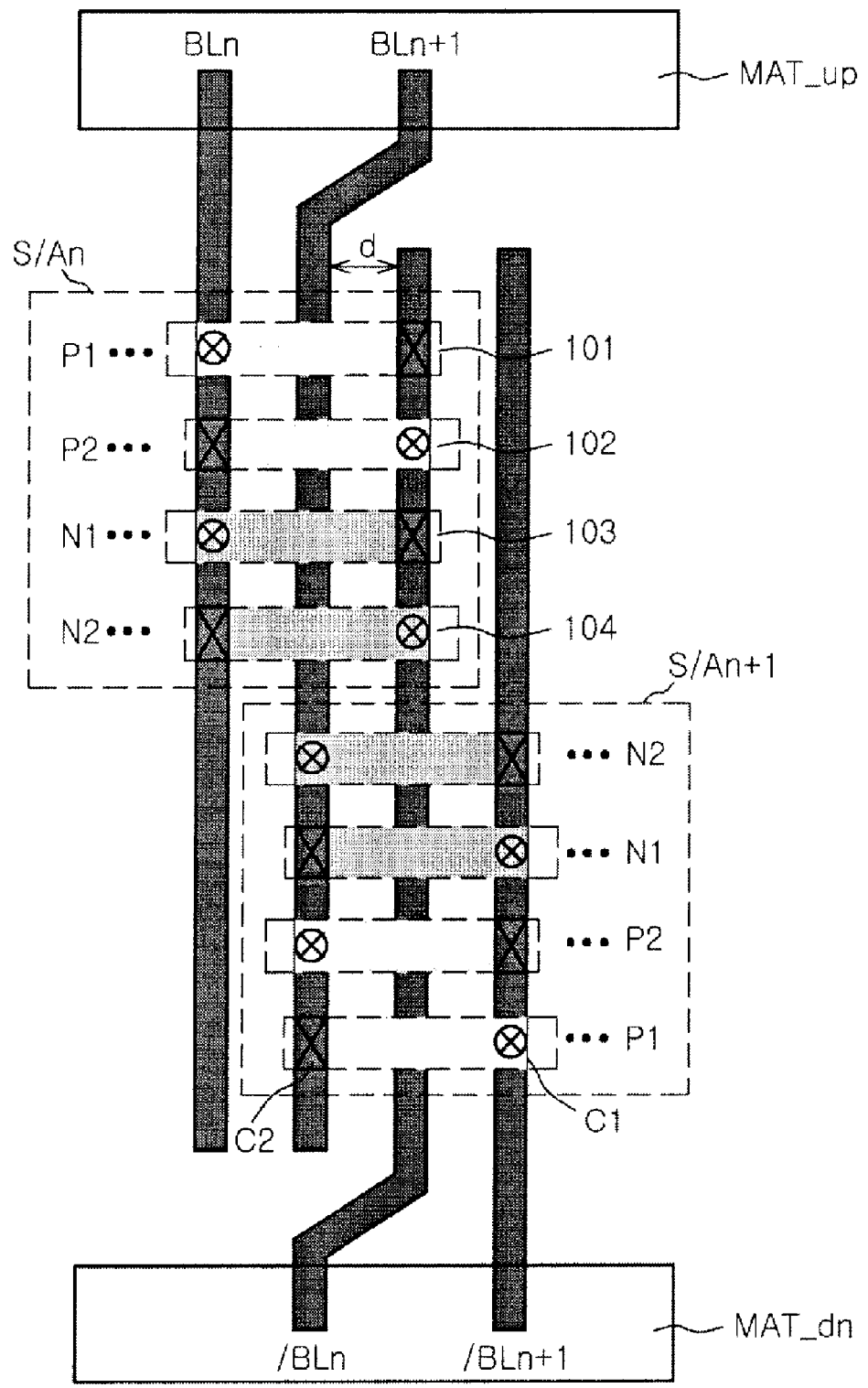
FIG. 2 is a plan view illustrating a sense amplifier array region of a semiconductor memory apparatus in accordance with an embodiment of the present invention.

Referring to FIG. 2, a semiconductor memory apparatus includes a plurality of mats MAT_up and MAT_dn. In this embodiment, for the purpose of convenience, an upper mat MAT_up and lower mat MAT_dn will be described as an example.

Each of the mats MAT_up and MAT_dn includes a plurality of word lines (not shown) and a plurality of bit lines BLn, BLn+1, /BLn and /BLn+1. The bit lines BLn and /BLn may be referred to as corresponding bit lines. Similarly, the bit lines BLn+1 and /BLn+1 may also be referred to as corresponding bit lines. Accordingly, the term "corresponding bit lines" may refer to a pair of bit lines comprising a bit line and its corresponding complementary bit line.

One pair of adjacent bit lines BLn and BLn+1 are configured to be arranged on the upper mat MAT_up at a constant interval, and the complementary bit lines /BLn and /BLn+1 are configured to be arranged on the lower mat MAT_dn, which share sense amplifiers together with the upper mat MAT_up, at a constant interval (e.g., the minimum feature size). The minimum feature size refers to a minimum distance resolvable by the current exposure equipment.

In an embodiment, the distance between the $(n+1)^{th}$ bit line BLn+1 of the upper mat MAT_up and the $n^{th}$ complementary bit line /BLn of the lower mat MAT_dn may also be substantially maintained at the minimum feature size.

In order to ensure the properties of transistors constituting the sense amplifiers, an $n^{th}$ sense amplifier S/An is configured to be disposed between the $n^{th}$ bit line BL of the upper mat MAT_up and the $n^{th}$ complementary bit line /BLn of the lower mat MAT_dn. Since the $(n+1)^{th}$ bit line BLn+1 of the upper mat MAT_up is interposed between the $n^{th}$ bit line BL of the upper mat MAT_up and the $n^{th}$ complementary bit line /BLn of the lower mat MAT_dn, the channel lengths of transistors constituting the latch of the sense amplifier S/An may substantially correspond to two pitches of the bit line.

Figure 3:
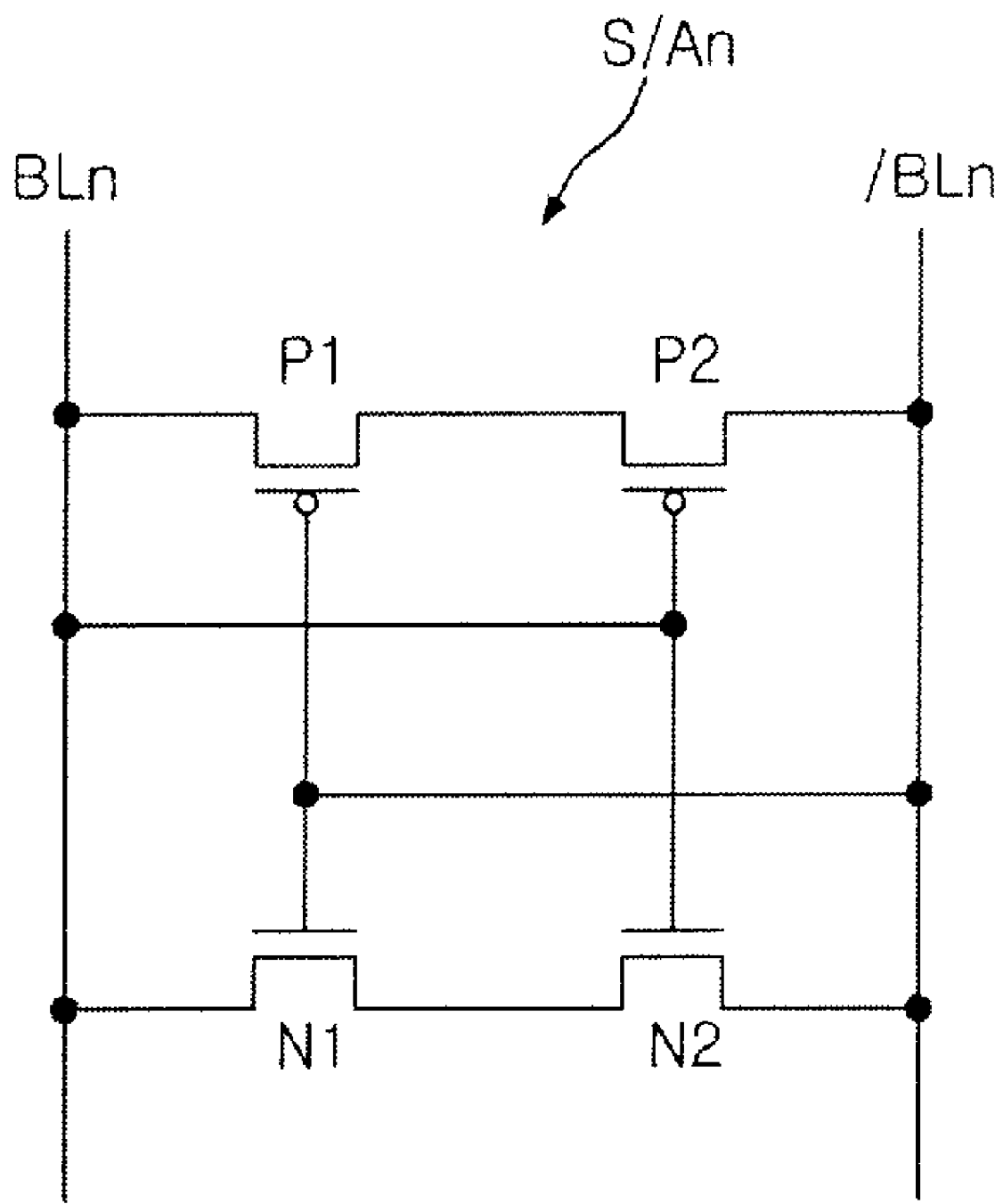
FIG. 3 is a circuit diagram of a latch constituting a sense amplifier array.

According to the latch constituting the $n^{th}$ sense amplifier S/An as illustrated in FIG. 3, first and second PMOS transistors P1 and P2 are configured to be serially connected between a pair of $n^{th}$ bit lines BLn and /BLn, and first and second NMOS transistors N1 and N2 are configured to be serially connected between the $n^{th}$ bit lines BLn and /BLn to achieve inverters in correspondence with the respective first and second PMOS transistors P1 and P2. In order such that the transistors P1, P2, N1 and N2 are connected in a latch configuration, a gate of the first PMOS transistor P1 and a gate of the first NMOS transistor N1 are configured to be electrically connected to each other, and a common gate line thereof is configured to be connected to the $n^{th}$ complementary bit line /BLn. In addition, a gate of the second PMOS transistor P2 and a gate of the second NMOS transistor N2 are configured to be electrically connected to each other, and a common gate line thereof is configured to be connected to the $n^{th}$ bit line BLn.

Referring again to FIG. 2, the first and second PMOS transistors P1 and P2 are configured to be formed on active regions 101 and 102 of first and second N wells, which are formed on a semiconductor substrate (not shown), respectively. First and second gates (not shown) for the first and second PMOS transistors P1 and P2, respectively, are configured to be disposed on the active regions 101 and 102 of the first and second N wells, and p type impurities are implanted into the active regions 101 and 102 of the first and second N wells located at both sides of the respective first and second gates, thereby completing the fabrication of the first and second PMOS transistors P1 and P2. The active regions 101 and 102 of the first and second N wells are configured to be disposed in parallel to each other between the $n^{th}$ bit lines BLn and /BLn.

Meanwhile, the first and second NMOS transistors N1 and N2 are configured to be formed on active regions 103 and 104 of first and second P wells, where the active region 103 is adjacent to the is second PMOS transistor P2. The first and second NMOS transistors N1 and N2 are formed substantially parallel to the first and second PMOS transistors P1 and P2. A first gate is configured to extend on the active region 103 of the first P well and a second gate is configured to extend on the active region 104 of the second P well. Furthermore, N type impurities are implanted into the active regions 103 and 104 of the first and second P wells located at both sides of the respective first and second gates, thereby completing the fabrication of the first and second NMOS transistors N1 and N2.

In this embodiment, for the purpose of convenience, description of interconnection relationship among the first and second PMOS/NMOS transistors P1, P2, N1, and N2, which constitute the latch, will be omitted.

In FIG. 2, C1 denotes contact with the bit line BLn or the complementary bit line /BLn and C2 denotes junction area contact.

In order to realize such a sense amplifier, the bit lines may be arranged at a sense amplifier array region (area between the upper mat and the lower mat) according to predetermined rules. That is, one pair of bit lines BLn and BLn+1 extending from the upper mat MAT_up and one pair of complementary bit lines /BLn and /BLn+1 extend from the lower mat MAT_dn are alternately disposed. Accordingly, the bit lines may be laid out as BLn, BLn+1, /BLn, and /BLn+1.

In this way, since another bit line BLn+1 is interposed between the bit line BLn and the complementary bit line /BLn for fabricating the sense amplifier, the bit line BLn and the complementary bit line /BLn, which constitute the sense amplifier, are substantially spaced apart from each other by about two pitches. Thus, a sufficient area is ensured between the bit line BLn and the complementary bit line /BLn for forming the sense amplifier. At this time, a bit line pitch on the cell array does not change, and the above line arrangement is sufficiently possible through appropriate routing of the bit lines through the sense amplifier array region.

As described above, an interval between the bit lines for fabricating the sense amplifier is sufficiently ensured, so that a critical dimension of a transistor constituting the sense amplifier is increased by one pitch or more as compared with the conventional art, resulting in the prevention of short channel phenomenon of a transistor.

According to an embodiment as described above, a pair of bit lines extending from an upper mat and a pair of complementary bit lines extending from a lower mat are alternately disposed on a sense amplifier array. Consequently, a distance between the bit line and the complementary bit line for fabricating a sense amplifier is sufficiently ensured, so that an area of transistors for a sense amplifier latch can be sufficiently ensured.

While exemplary embodiments of the invention have been described, the invention need not be so limited. For example, FIG. 2 describes two bit lines from each mat MAT_up and MAT_dn for simplicity. However, various embodiments of the invention may disclose more than two bit lines from a mat. Various embodiments of the invention may also disclose various configurations for the bit lines and the corresponding complementary bit lines such that the number of bit lines between corresponding bit lines may vary.

While certain embodiments have been described above, it will be understood to those skilled in the art that the embodiments described are by way of example only. Accordingly, a semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a sense amplifier array region including a first and second sense amplifiers;
an upper mat and a lower mat disposed while interposing the sense amplifier array region therebetween;
a first and second bit lines disposed to extend toward the sense amplifier array region from the upper mat, one after another; and
a first and second bit lines disposed to extend toward the sense amplifier array region from the lower mat, one after another,
wherein the first and second bit lines of the upper mat and the first and second complementary bit lines of the lower mat are disposed at a preset interval in the sense amplifier array region, the first sense amplifier is formed between the first bit line and the first complementary bit line, and the second sense amplifier is formed between the second bit line and the second complementary bit line.

2. The semiconductor memory apparatus according to claim 1, wherein the second bit line is arranged between the first bit line and the first complementary bit line.

3. The semiconductor memory apparatus according to claim 1, wherein the first and second bit lines are configured to be spaced apart from each other by a same distance, the first and second complementary bit lines are configured to be spaced apart from each other by the same distance, and the second bit line and the first complementary bit line are configured to be spaced apart from each other by the same distance.

4. The semiconductor memory apparatus according to claim 1, wherein each of the sense amplifiers comprises a latch.

5. The semiconductor memory apparatus according to claim 4, wherein the latch comprises a pair of PMOS transistors and a pair of NMOS transistors.

6. The semiconductor memory apparatus according to claim 5, wherein lengths of the respective PMOS and NMOS transistors are substantially equal to an interval between a bit line and a corresponding complementary bit line.

7. A semiconductor memory apparatus comprising:
a sense amplifier array region;
an upper mat including first and second bit lines configured to be disposed at one side of the sense amplifier array region and extend toward the sense amplifier array region while maintaining a predetermined interval therebetween;
a lower mat including first and second complementary bit lines configured to be disposed at the other side of the sense amplifier array region and extend toward the sense amplifier array region while maintaining the predetermined interval therebetween;
a first sense amplifier configured to be formed between the first bit line and the first complementary bit line; and
a second sense amplifier configured to be formed between the second bit line and the second complementary bit line,
wherein the second bit line is between the first bit line and the first complementary bit line, the first complementary bit line is between the second bit line and the second complementary bit line, and each bit line in the sense amplifier array region is spaced apart from its neighboring bit line by the predetermined interval.

8. The semiconductor memory apparatus according to claim 7, wherein the first sense amplifier comprises:
first and second PMOS transistors disposed in parallel to each other and formed substantially between the first bit line and the first complementary bit line; and
first and second NMOS transistors disposed in parallel to each other and formed substantially between the second bit line and the second complementary bit line.

9. The semiconductor memory apparatus according to claim 8, wherein the first and second NMOS transistors are substantially parallel to the first and second PMOS transistors.

10. The semiconductor memory apparatus according to claim 8, wherein the first and second PMOS transistors are electrically connected to the first and second PMOS transistors to form a latch.

11. A semiconductor memory apparatus comprising:
a sense amplifier array region comprising a plurality of sense amplifiers;
an upper mat and a lower mat with the sense amplifier array region therebetween;
a first and second bit lines configured to extend toward the sense amplifier array region from the upper mat; and
a first and second complementary bit lines configured to extend toward the sense amplifier array region from the lower mat,
wherein there is a first separation between the first bit line and the second bit line, between the first complementary bit line and the second complementary bit line, and between the second bit line and the first complementary bit line, in at least a portion of the sense amplifier array region.

12. The semiconductor memory apparatus according to claim 11, wherein a first sense amplifier in the sense amplifier array region is configured between the first bit line and the first complementary bit line, and the second sense amplifier in the sense amplifier array region is configured between the second bit line and the second complementary bit line.

13. The semiconductor memory apparatus according to claim 12, wherein there is a second separation between the first bit line and the first complementary bit line, and the second bit line and the second complementary bit line in the sense amplifier array region, respectively.

14. The semiconductor memory apparatus according to claim 13, wherein the second separation is substantially twice the first separation.

15. The semiconductor memory apparatus according to claim 13, wherein the second separation is substantially a multiple of the first separation.

* * * * *